(12) United States Patent
Di Vincenzo et al.

(10) Patent No.: US 9,887,005 B2
(45) Date of Patent: Feb. 6, 2018

(54) DEVICES AND METHODS TO PROGRAM A MEMORY CELL

(71) Applicant: OVONYX MEMORY TECHNOLOGY, LLC, Alexandria, VA (US)

(72) Inventors: Umberto Di Vincenzo, Capriate San Gervasio (IT); Carlo Lisi, Milan (IT)

(73) Assignee: OVONYX MEMORY TECHNOLOGY, LLC, Alexandria, VA (US)

( * ) Notice: Subject to any disclaimer, the term of this patent is extended or adjusted under 35 U.S.C. 154(b) by 0 days.

(21) Appl. No.: 15/290,904

(22) Filed: Oct. 11, 2016

(65) Prior Publication Data
US 2017/0098473 A1   Apr. 6, 2017

Related U.S. Application Data

(63) Continuation of application No. 14/804,122, filed on Jul. 20, 2015, now Pat. No. 9,496,035, which is a continuation of application No. 14/325,075, filed on Jul. 7, 2014, now Pat. No. 9,087,583, which is a continuation of application No. 13/974,731, filed on Aug. 23, 2013, now Pat. No. 8,773,900, which is a continuation of application No. 13/096,966, filed on Apr. 28, 2011, now Pat. No. 8,520,431.

(30) Foreign Application Priority Data
Mar. 11, 2011   (WO) .................. PCT/IT2011/000067

(51) Int. Cl.
*G11C 13/00*   (2006.01)

(52) U.S. Cl.
CPC ...... *G11C 13/0069* (2013.01); *G11C 13/0004* (2013.01); *G11C 13/0064* (2013.01)

(58) Field of Classification Search
CPC .................................. G11C 13/0069
USPC ........................................ 365/163
See application file for complete search history.

(56) References Cited

U.S. PATENT DOCUMENTS

| 7,149,103 | B2 |  | 12/2006 | Ahn |
| 7,307,268 | B2 | * | 12/2007 | Scheuerlein ....... G11C 13/0004 257/2 |
| 7,359,231 | B2 |  | 4/2008 | Venkataraman et al. |
| 7,391,642 | B2 |  | 6/2008 | Gordon et al. |
| 7,577,024 | B2 |  | 8/2009 | Fackenthal et al. |
| 7,639,522 | B2 |  | 12/2009 | Cho et al. |
| 7,656,719 | B2 |  | 2/2010 | Cho et al. |

(Continued)

FOREIGN PATENT DOCUMENTS

| CN | 1945740 A | 4/2007 |
| CN | 101329905 A | 12/2008 |

(Continued)

OTHER PUBLICATIONS

Bedeschi, et al., "Bit-Line Biasing Technique for Phase-Change Memories," International Conference on Signals and Electronic Systems, pp. 229-232, Sep. 13-15, 2004, Poland, 4 pages.

(Continued)

*Primary Examiner* — Son Mai
(74) *Attorney, Agent, or Firm* — Holland & Hart LLP

(57) ABSTRACT

Subject matter disclosed herein relates to memory devices and, more particularly, to programming a memory cell.

20 Claims, 4 Drawing Sheets

(56) References Cited

U.S. PATENT DOCUMENTS

| | | | |
|---|---|---|---|
| 7,729,163 | B2 | 6/2010 | Ramani et al. |
| 7,869,268 | B2 | 1/2011 | Giovinazzi et al. |
| 8,223,565 | B2 | 7/2012 | Ueda |
| 8,377,741 | B2 | 2/2013 | Savransky et al. |
| 8,411,488 | B2 | 4/2013 | Kawabata et al. |
| 8,531,892 | B2 | 9/2013 | Yoon |
| 8,654,564 | B2 | 2/2014 | Kwak et al. |
| 8,934,292 | B2 | 1/2015 | Costa et al. |
| 2009/0034320 | A1* | 2/2009 | Ueda .................. G11C 11/16 365/148 |
| 2011/0096588 | A1* | 4/2011 | Fasoli ............... G11C 13/0004 365/148 |

FOREIGN PATENT DOCUMENTS

| | | | |
|---|---|---|---|
| WO | WO 2011070769 | A1 | 6/2011 |
| WO | WO 2011080769 | A1 | 7/2011 |

OTHER PUBLICATIONS

Office Action dated Jan. 20, 2015 in corresponding Korean Application No. 10-2013-7026474, filed Oct. 7, 2013, 9 pages.

Office Action dated Nov. 26, 2014 in corresponding Chinese Application No. 201180069205, filed Sep. 11, 2013, 11 pages.

Handy, "Phase Change Memory will Change Memory System Design," http://www.rtcmagazine.com/articles/view/101556, Mar. 2, 2011, 6 pages.

Hudgens, et al., "Overview of Phase-Change Chalcogenide Nonvolatile Memory Technology," MRS Bulletin, Nov. 2004, 4 pages.

ISA/EPO, International Preliminary Report on Patentability, Int'l Appl. No. PCT/IT2011/000067, dated Sep. 17, 2013, European Patent Office, Rijswijk, NL, 15 pages.

ISA/EPO, International Search Report and Written Opinion of the International Searching Authority, Int'l Appl. No. PCT/IT2011/000067, dated Jul. 24, 2012, European Patent Office, Rijswijk, NL, 20 pages.

Invitation to Pay Additional Search Fees and, Where Applicable, Protest Fee (Communication Relating to the Results of the Partial International Search), International Application No. PCT/IT2011/000067, dated Feb. 3, 2012, 5 pages.

Lee, et al., "Architecting Phase Change Memory as a Scalable DRAM Alternative," ISCA '09, Jun. 20-24, 2009 Austin, TX., 12 pages.

Numonyx, "The Basics of Phase Change Memory Technology," numonyx.com, Copyright 2007-2008, 10 pages.

Pronin, "Phase Change Memory: Fundamentals and Measurement Techniques," Keithley, Mar. 2010, 4 pages.

Terao, et al., "Electrical Phase-Change Memory: Fundamentals and State of the Art," Japanese Journal of Applied Physics 48, 2009, 13 pages.

* cited by examiner

DEVICES AND METHODS TO PROGRAM A MEMORY CELL

RELATED APPLICATION

This application is a continuation of U.S. patent application Ser. No. 14/804,122 by Di Vincenzo et al., entitled "Devices and Methods to Program a Memory Cell," filed Jul. 20, 2015, which is a continuation of U.S. patent application Ser. No. 14/325,075 by Di Vincenzo et al., entitled "Devices and Methods to Program a Memory Cell," filed Jul. 7, 2014, which is a continuation of U.S. patent application Ser. No. 13/974,731 by Di Vincenzo et al., entitled "Devices and Methods to Program a Memory Cell," filed Aug. 23, 2013, which is a continuation of U.S. patent application Ser. No. 13/096,966 by Di Vincenzo et al., entitled "Devices and Methods to Program a Memory Cell," filed Apr. 28, 2011, which claims the priority benefit of International Patent Application No. PCT/IT2011/000067 entitled "Devices and Methods to Program a Memory Cell," filed Mar. 11, 2011, assigned to the assignee hereof, and each of which is expressly incorporated by reference in its entirety herein.

BACKGROUND

Field

Subject matter disclosed herein relates to memory devices and, more particularly, to programming a memory cell.

Information

A type of memory of interest includes, for example, variable resistance memory, such as resistance random access memory or phase change memory (PCM). A state of PCM material forming a memory cell, referred to herein as phase change material, may be affected through application of heat. However, programming (e.g., writing to) a PCM cell typically may be affected through modulation of electrical parameters, such as current. For example, if a current is applied to a resistive material, an increase in the current may raise temperature and a decrease in the current may reduce temperature.

BRIEF DESCRIPTION OF THE FIGURES

Non-limiting and non-exhaustive implementations will be described with reference to the following figures, wherein like reference numerals refer to like parts throughout the various figures unless otherwise specified.

DETAILED DESCRIPTION

Reference throughout this specification to "one implementation," "an implementation," or "certain implementations" means that a particular feature, structure, or characteristic described in connection with a described implementation(s) may be included in at least one implementation(s) of claimed subject matter. Thus, appearances of the phrase "in one example implementation," "in an example implementation," or "in certain example implementations," in various places throughout this specification are not necessarily all referring to the same implementation(s). Furthermore, particular features, structures, or characteristics may be combined in one or more implementations.

A type of memory of interest includes, for example, variable resistance memory, such as resistance random access memory or phase change memory (PCM). It is expected that a variety of consumer devices, including cell phones, personal digital assistants, tablets, laptop computers or any combination thereof, as well as other communications or computing devices, may make use of a variety of types of memory, including these examples of variable resistance memory. In PCM, a state of phase change material forming a memory cell may be affected through application of heat. Typically, a PCM cell of memory has a predominantly crystalline state or a predominantly amorphous state, although multi-state memory may also be implemented using PCM material. A state of a cell may be controlled at least in part from a process of cooling the cell after application of heat. For example, if a cell exhibits a predominantly crystalline state, it may be interpreted as storing one binary state, such as a binary "1"; if a cell exhibits a predominantly an amorphous state, a cell may be interpreted as storing another binary state, such as a binary "0." It is understood hereinafter that reference to a crystalline or amorphous state includes a predominantly crystalline or predominant amorphous state, respectively. A crystalline state may result from a relatively slow cooling process and an amorphous state may result from a relatively quick cooling process, as explained in more detail.

Therefore, to program a PCM cell to an amorphous state, a temperature of a cell may be reduced from a relatively high temperature, sufficient to melt cell material, to a relatively low temperature, sufficient to solidify the cell material, in a relatively short time period, but without significant crystallization. In contrast, typically, to program a PCM cell to a crystalline state, a temperature of a cell may be held between the two foregoing temperatures for a time period permitting material time to crystallize as it solidifies.

Figure 1:
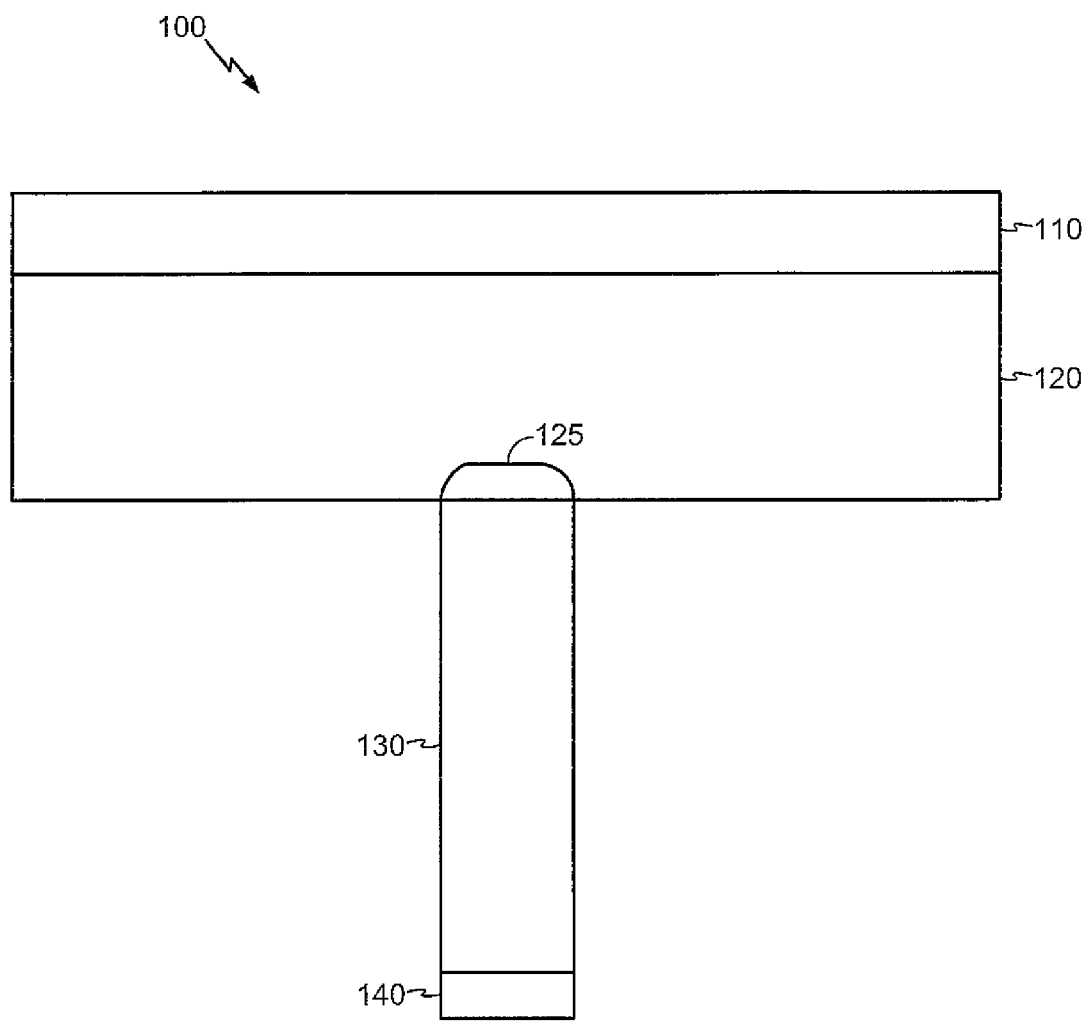
FIG. 1 is a schematic diagram illustrating an embodiment of a configuration of a resistive heater applied to a PCM cell.

In programming a PCM cell, temperature typically may be affected through modulation of electrical parameters, such as current or voltage. A resistive heater configuration, such as shown in FIG. 1, for example, may be employed. Likewise, a self heat-type configuration may be employed, such as illustrated, for example, in US Patent Publication No. 20100163817, filed Dec. 30, 2008, published Jul. 1, 2010, to Savransky et al.; however, it is noted that this is just one example of a self-heat type configuration. Many others are, of course, possible and intended to be included within claimed subject matter scope.

Modulating electrical parameters to affect temperature may ultimately be challenging. Modulation of current or voltage may modulate temperature, as expected; however, changes in temperature for PCM material may modulate resistance, which is less typical or expected. Likewise, resistance changes with temperature for a given cell may be difficult to predict accurately in advance.

FIG. 1 is a schematic diagram illustrating an embodiment of a configuration of a resistive heater applied to a PCM cell. As illustrated, a layer of chalcogenide, for example, denoted 120, is sandwiched between a top electrode 110 and a bottom electrode 140. A resistive heater 130 extends from bottom electrode 140 and physically contacts layer 120. Current injected into a junction of layer 120 and heater 130 induces a phase change, denoted 125, in phase change material through Joule heating.

As previously described, to change a memory state of a PCM cell, a cell may be heated to a relatively high temperature so that a cell may enter a melting phase. Current may flow in a cell, producing heating and melting the PCM material. Chalcogenide comprises an example of PCM material that may be employed, although claimed subject matter is not limited in scope in this respect, of course. After a melting phase, again, described above, temperature may be reduced to program a cell to a memory state. If temperature is reduced relatively slowly, a crystalline state may be stored. However, if temperature is reduced relatively quickly, an amorphous state may be stored. A cell in an amorphous state typically exhibits relatively high resistance, whereas a cell in a crystalline state typically exhibits a relatively low resistance.

As suggested above, resistance of a phase change material, for example, typically depends, at least in part, on temperature of the material itself. Therefore, the following relationship [1], regarding power consumption where resistive heating is employed, may apply:

$$\text{power} = R(\text{temp}) \cdot 1^2 = V^2/R(\text{temp}) \quad [1]$$

Thus, it may be challenging to predict appropriate or desirable electrical parameters to employ in a process to program a PCM cell to a crystalline state, for example. More specifically, and as suggested previously, it may be desirable to permit temperature to decline relatively slowly over time. Again, as previously suggested, this typically allows sufficient time for crystallization to take place, such as through bond formation between molecules. However, because material resistance may vary, at least in part, depending upon temperature, it may be difficult to predict an appropriate adjustment of electrical parameters to permit this to occur in a manner desired for a given cell.

As the relationship above demonstrates, for a given level of power consumption, current (squared) is directly proportional to resistance, whereas voltage (squared) is inversely proportional to resistance. Therefore, in a situation in which it may be difficult to predict in advance how resistance of a particular cell may vary, this observation may be employed to better effect a reduction in incidence of quick, significant temperature drops. For example, if around a melting point of a given cell, resistance increases, a slowly decreasing current may at least partially offset an increasing resistance. Conversely, if around a melting point of a given cell, resistance decreases, a decreasing voltage may at least partially offset a decreasing resistance. Therefore, a technique or a device capable of operating in a current mode or a voltage mode, depending, for example, on the particular cell, may provide a desirable mechanism to program a PCM cell.

Figure 2:
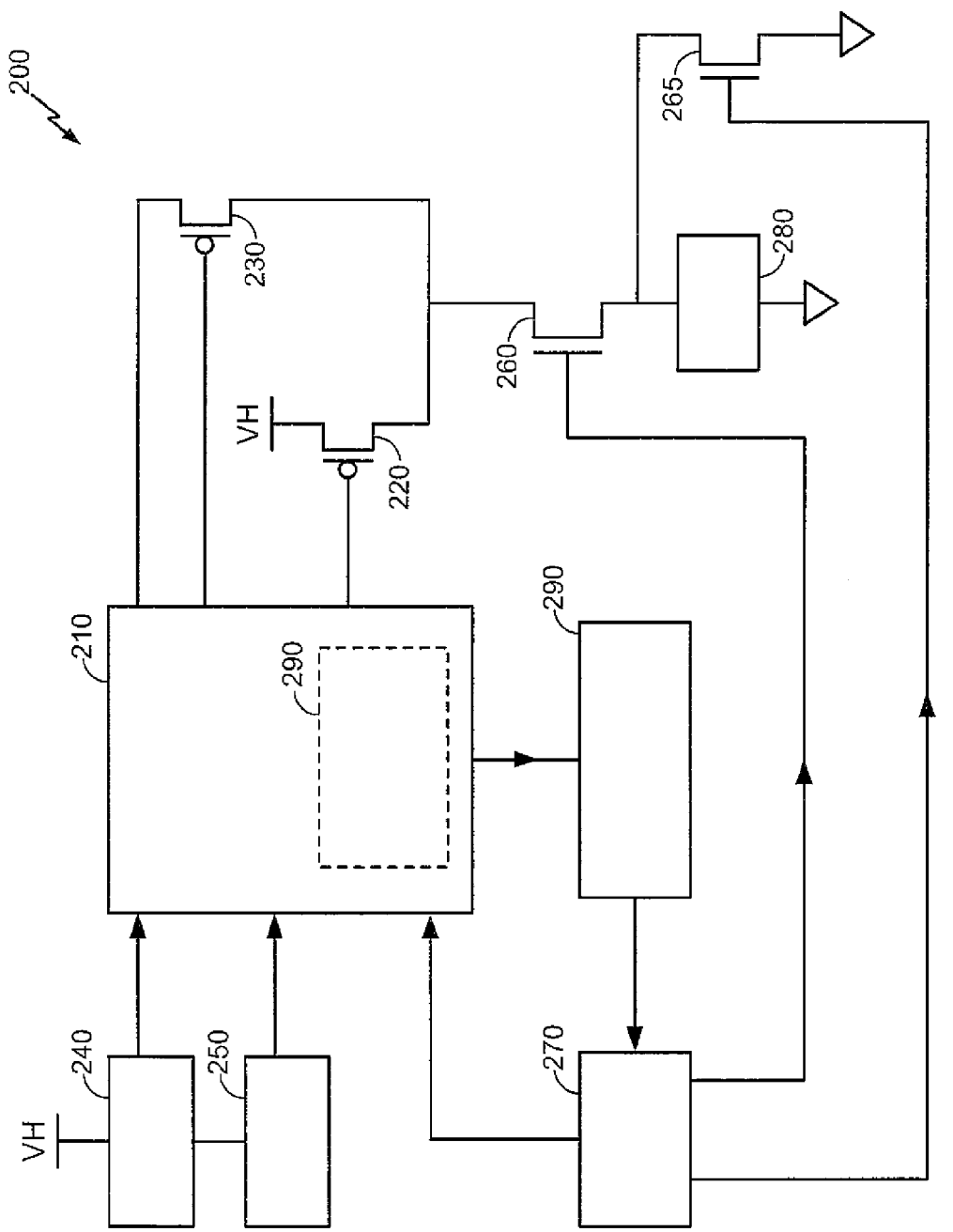
FIG. 2 is a block diagram illustrating an embodiment of a controller able to operate in voltage mode or in current mode.

As one example of an implementation, FIG. 2 is a block diagram illustrating an embodiment of a controller able to operate in voltage mode or in current mode. It is noted that in at least one embodiment, operating modes of a controller may be programmed, such as by a user. For example, a user may in at least one embodiment be able to program for a given cell whether to initially employ a voltage mode or a current mode of operation. Therefore, a PCM cell or PCM array may be programmed by applying a current signal or by applying a voltage signal, as described in more detail below, for at least one embodiment. Likewise, other aspects may be programmed, such as particular signal levels or particular signal profiles to employ. Of course, these are merely examples of implementations included within the scope of claimed subject matter. However, it is not intended or expected that claimed subject matter is necessarily limited to a particular example implementation.

At a high level, controller 210 of FIG. 2 is capable of applying signals, such as to a bit line, for example, to program a cell that may be in its melting phase. For example, in at least one particular embodiment, switches, such as gates 220 and 230, may enable two approaches to programming a cell. Likewise, voltage reference 240 and current reference 250 may provide a voltage or current bias signal value level to execute the particular approach that may be selected in at least one embodiment.

For example, a PCM cell array may employ a structure in which a system decoder may allow a cell to connect electrically to gate 220 or to gate 230. In FIG. 2, for example, gate 260 may be driven by microcontroller 270 which may, for example, accomplish decoding and permit electrical connection to a PCM cell, such as 280, so that a voltage signal or a current signal may be applied, as appropriate. Likewise, microcontroller 270 may also drive controller 210. Therefore, to program a binary "1," for example, controller 210 may operate in voltage mode or in current mode so that an appropriate electrical signal may be applied via gate 260 in a manner to accomplish desired programming.

For example, a device, such as a controller, may be employed to apply one or more signals in a manner so as to transition one or more PCM cells to a particular crystalline state, such as from a melting phase. For example, a PCM cell array may comprise a first PCM cell and a second PCM cell. Therefore, a current signal may be applied so as to transition the first PCM cell to a crystalline state, whereas a voltage signal may be applied so as to transition the second PCM cell to a crystalline state. Referring, for example, to the embodiment previously described, but without limitation, controller 210, as an example, may operate in current mode for the first PCM cell and in voltage mode for the second PCM cell. Current or voltage signals may be applied in a manner that is not concurrent. Likewise, a similar approach may be employed with a group of PCM cells rather than a single PCM cell. Therefore, a current signal may be applied to a first group of PCM cells to program cells whereas a voltage signal may be applied to a second group of PCM cells to program cells.

Likewise, in another situation or embodiment, a device may program the same cell at separate times. For example, a PCM cell in a melting phase may be transitioned to a crystalline state. For example, a device may be employed to apply a current signal in a manner so as to accomplish a state transition. However, as suggested previously, cell resistance may vary with temperature which may introduce a certain degree of unpredictability. Therefore, it may be the case that, for a particular cell, resistance was decreasing and therefore, employing a current signal may have resulted in a faster temperature reduction which may not be desirable. As a result, it may be that a PCM cell programmed using a current signal may be unable to comply with memory cell performance parameters associated with a crystalline state if a quick temperature transition were to occur. For example, resistance of a cell after crystallization may be higher than desirable as a result of a relatively quick temperature drop. Typically, while a cell may have crystallized, it may be that not a sufficient amount of crystallization will have taken place. It may at times be desirable to employ a device to re-program a cell using a voltage signal rather than a current signal. It shall, of course, be appreciated that, in another situation, such as for another cell, a voltage signal may have been applied resulting in a cell unable to meet desired performance parameters and subsequently, a current signal may be applied to re-program the cell.

It is noted that for a particular embodiment, controller 210, whether operating in current mode or in voltage mode, may operate in a manner to produce a RAMP signal at least approximately. For example, if a current signal is being produced, then the current level may decrease approximately linearly in value over time to store a binary "1," for example. Likewise, if a voltage signal is being produced, then the voltage signal level may decrease approximately linearly in value over time to store a binary "1." Nonetheless, it is to be appreciated that claimed subject matter is not limited in scope in this respect. For example, in alternative embodiments, it may be desirable to operate in current mode or voltage mode, but to have signal value level decrease in a manner other than linearly over time. Similarly, in an alternative embodiment, it may be that signal value level does not decrease immediately. For example, a relatively flat or nearly constant signal value level may be applied before signal value level begins to decrease over time.

It is noted that, in a situation in which a cell may be successively programmed employing different modes of operation, such as a voltage mode or a current mode, signals employed to program a particular cell may be applied at distinctly separate and non-overlapping periods of time. By contrast, in a situation in which a group of PCM cells may be programmed essentially at one time, programming may take place largely concurrently.

A device (e.g., apparatus), which may include a controller capable of operating in a current mode or a voltage mode, may be capable of programming a PCM cell to a set state or to a reset state. In this context, a set state may be employed to indicate storage of a binary "1" state or a binary"0" state. A state may, for example, be associated with a crystalline state of a PCM cell in which relatively low resistance is exhibited, as previously indicated. However, alternatively, a state may be associated with an amorphous state in which relatively high resistance is exhibited, again, discussed previously. A device may be further capable of verifying that a particular PCM cell stores a particular state, such as binary "1" or binary "0," by, for example, applying a current and measuring an output voltage, for example.

As illustrated in FIG. 2, for at least one embodiment, a capability may be included to detect a signal value level. Responsive to (e.g., upon or after) detecting a particular signal value level having been reached, application of a current signal or a voltage signal, as appropriate, may cease if desirable. FIG. 2, for example, includes an embodiment of a detector block 290. Detector block 290 may provide a signal to microcontroller 270 if a desired signal value level is reached, for example.

Figure 3:
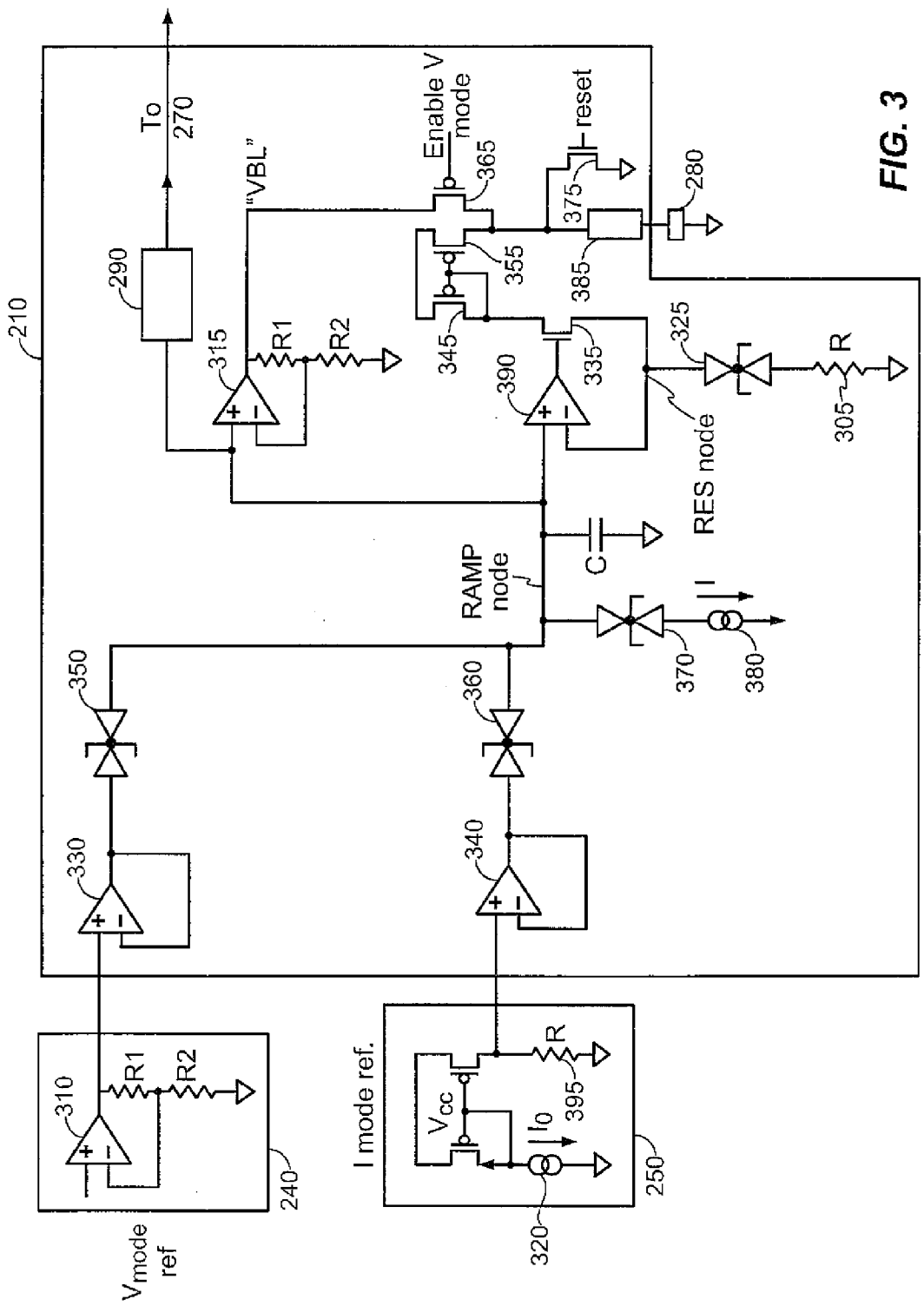
FIG. 3 is a circuit diagram illustrating the embodiment of FIG. 2 in greater detail.

FIG. 3 is a circuit diagram illustrating the embodiment of FIG. 2, controller 210, as well as signal value level references 240 and 250, in greater detail. It is noted that the embodiment shown in FIG. 3 includes detector 290, which in FIG. 2 is shown as incorporated in controller 210 (shown in dotted lines) or as separate from controller 210. It is noted that claimed subject matter is not limited in scope to the embodiment(s) shown in FIGS. 2 and 3. Rather, sample implementations are merely provided for illustration purposes and are not intended to limit claimed subject matter scope in any way.

Referring to FIG. 3, controller 210 includes a RAMP node. A RAMP node may be employed to produce a current RAMP which may be applied to a bit line if controller 210 operates in current mode or a voltage RAMP if controller 210 operates in voltage mode. It is understood that in this context, a signal which may approximate a RAMP shape, for example, may comprise a current RAMP or a voltage RAMP, such as a signal having a signal value level which decreases approximately linearly over time. Of course, as previously described, signals having a shape or profile other than an approximate RAMP may likewise be employed.

Controller 210 may include two transmission gates, such as 350 and 360. In this context, various terms, such as switch, gate, or transmission gate, as examples, are generally understood to refer to electrical components that are virtually interchangeable from the perspective of one of ordinary skill in the art. As described in more detail hereinafter, gates 350 and 360 may be employed to select a mode of operation for controller 210. Likewise, buffers 315 and 390 may be employed to bias bit line 385 through application of a signal, such as a current signal or voltage signal, as previously described, and as shall be described in more detail below. Referring to FIG. 2, gate 260 may be employed to initiate a RAMP signal based, at least in part, on a signal from microcontroller 270. Likewise, gate 220 may be employed for current mode operation, while gate 230 may be employed for voltage mode operation, again, as described in more detail below.

For operation of controller 210 in current or voltage mode, a PCM cell may be reset through application of a signal that results in melting PCM material of the cell through application of a current bias or voltage bias signal. Signal biases may have signal value levels such that, for a particular cell, for example, a temperature exceeding a melt temperature for the cell may be reached. A melt temperature for a cell refers to a temperature which, if the temperature of the particular cell, results in a melting phase of the cell material. Likewise, after a cell enters a melting phase, a decreasing current signal or a decreasing voltage signal, depending, again, on the operating mode of controller 210, may be applied in at least one embodiment.

Current mode operation is described immediately below. Block 250 may generate a voltage signal, designated in FIG. 3 as a voltage signal value level for "I" or current mode. A voltage signal value level may be applied to RAMP node. Likewise, a voltage signal value level may be replicated on node RES as a result of buffer 390. To generate a voltage signal value level, microcontroller 270 may produce a signal to switch transmission gate 360 and transmission 325 "on" while switching transmission gate 350 "off." In this context, "on" refers to a device state permitting a voltage signal applied to an input terminal to appear at an output terminal; whereas, "off" refers to a device state not permitting a voltage signal applied to an input terminal to appear at an output terminal. Voltage VCC in block 250 may result in generation of current Io through application of a voltage to resistance 395. Current Io comprises a current sufficient to exceed a melt temperature of a PCM cell, such as cell 280, for example. Current Io for at least one embodiment is independent of temperature or cell manufacture variability by comprising a current bias having a current signal value level such that a PCM cell may reach a temperature likely to exceed a highest melt temperature of the PCM cells of the PCM array. This may, for example, comprise a relatively small or modest amount of excess temperature, while comprising an amount that is nonetheless sufficient. As a result of gate 360 and gate 325 along with resistance 305, which comprises a resistance having a value intended to at least approximately match resistance 395, a current through gate 335 may likewise at least approximately equal Io. Current through gate 335 may likewise be mirrored via gates 345 and 355 so as to be applied via bit line 385 to cell 280.

Application of current Io, therefore, may result in a temperature of a PCM cell rising to a temperature value level that exceeds a likely melt temperature of any cells of a PCM array.

After a melt phase in PCM cell is realized, a current RAMP may be produced and applied. In at least one embodiment, microcontroller 270 may switch transmission gate 370 "on" and transmission gate 360 "off." This may result in at least approximately producing a voltage RAMP signal at RAMP node. Current "I" designated by current source 380 may discharge RAMP node, which may generate a current RAMP through gate 335, which, again, may be mirrored by gates 345 and 355 to bit line 385 and applied to cell 280. A binary "1" may therefore be stored in cell 280 through application of a current RAMP. However, other programming may be employed to result in a binary "0" being stored in cell 280. Instead of producing a current RAMP, as described above, microcontroller 270 may switch "off" gate 260 and switch "on" gate 265. Current signal level value may decline more quickly than with a current RAMP signal, resulting in a binary "0" state for reasons previously discussed.

As suggested previously, in some circumstances, it may be desirable to operate in voltage mode rather than in current mode. In voltage mode, at least an approximate voltage RAMP signal may be produced and applied to a PCM cell, such as 280, rather than at least an approximate current RAMP, as described above. However, similar to the description previously provided, in voltage mode, controller 210 may apply a voltage bias having a voltage signal value level which may result in cell 280 reaching a temperature that is likely to exceed a melt temperature of a PCM cell so as to place cell 280 in a melting phase. After this has occurred, as described in connection with current mode operation, likewise in voltage mode operation, a voltage RAMP signal may be produced and applied so that a binary "1" state may be stored. Alternatively, a binary "0" may be stored. Note that whether operating in current mode or voltage mode, controller 210 may have a capability to generate a reset state for cell 280, for example, so that a cell may be programmed to store a binary "1" state or a binary "0" state, as desired or as appropriate.

For voltage mode operation, referring to FIG. 3, block 310 may produce a voltage bias signal having a voltage signal value level which may be applied to RAMP node and generate a voltage signal value level to be applied to bit line 385 referred to in FIG. 3 as "VBL." It is noted that "VBL" is produced via a voltage divider arrangement at buffer 315. For example, if "VX" comprises a voltage signal value level generated by block 310, the following relationship [2] applies:

$$VBL = VX \cdot (R1+R2)/R2 \qquad [2]$$

For "VBL" to be produced, microcontroller 270 may switch gate 350 "on" and gate 25 360 "off." Likewise, microcontroller 270 may apply a signal to gate 365 so that voltage signal value level "VBL" is applied to bit line 385 resulting in application of voltage signal value level "VBL" to cell 280. As a result, cell 280 may enter a melting phase.

To produce a voltage RAMP to be applied to cell 280, microcontroller 270 switches gate 370 "on" and switches "off" gate 350. As before, a voltage RAMP may be produced at RAMP node as a result of current "I" discharging RAMP node. However, whereas previously application of a voltage to buffer 390 resulted in application of a current RAMP to bit line 385, instead, application of a voltage to buffer 315 may produce a voltage RAMP applied to bit line 385 and, likewise, may result in a voltage signal comprising a RAMP signal being applied to cell 280.

As described previously in connection with current mode operation, likewise, in voltage mode operation, a binary "1" may be stored in cell 280. Likewise, to program storage of a binary "0," microcontroller 270 may switch "off" gate 260 and switch "on" gate 265 after cell 280 is in a melting phase. Similar to bias current Io, voltage "VBL" comprises a voltage bias having a signal value level that if applied may produce a temperature that exceeds any melt temperature of any cell of PCM array.

Figure 4:
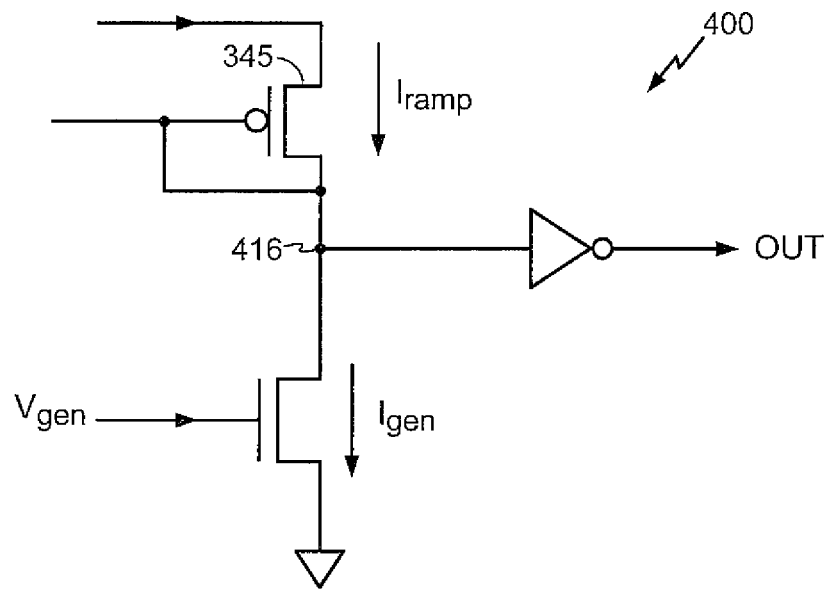
FIGS. 4 and 5 are circuit diagrams illustrating embodiments of circuitry to detect a signal level.
Figure 5:
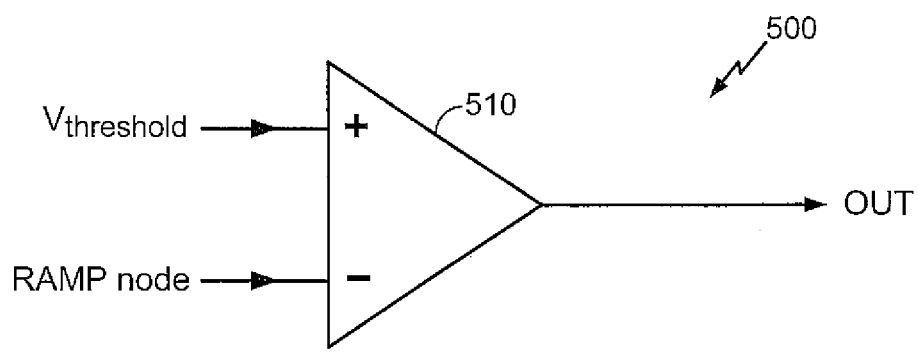

FIGS. 4 and 5 are circuit diagrams illustrating embodiments of circuitry to detect a signal level, such as if a controller may be operating in current mode or voltage mode, respectively. For example, referring to FIG. 4, along with FIG. 3, a current may be flowing in gate 335, which may be mirrored by gates 345 and 355 to bit line 385, as previously described. Therefore, as shown in FIG. 4, a gate may be placed at a node 416. A current to produce a current RAMP may be denoted Iramp. A current signal value level, denoted Igen, is also illustrated in FIG. 4 and may be produced by applying a voltage signal value level, denoted Vgen, to gate 335. If Iramp is higher than Igen, a low signal at OUT may be provided to microcontroller 270. Likewise, if Iramp becomes lower than Igen, a high signal OUT may be provided to microcontroller 270. Application of a current signal may cease as a result. Microcontroller 270 therefore may receive a signal indicating that a desired signal value level has been reached. Likewise, referring to FIG. 5 for voltage mode operation, a differential amplifier 510 may have voltage signals V threshold and RAMP node as input signals. Therefore, if RAMP node becomes lower than V threshold, OUT should signal high indicating to microcontroller 270 that a desired signal value level has been reached. Application of a voltage signal may cease as a result.

In at least one embodiment, employing circuitry to detect a signal level may be desirable in terms of reducing delays between initiating program pulses for storage of memory states in PCM cells. For example, to initiate a melting phase or to permit a binary "0" or binary "1" to be stored, a signal value level may more typically be applied for a set period of time. However, instead, for an embodiment, for example, a signal may be applied until a desired signal level is reached. With a changing signal value level, this may occur more quickly, resulting in programming of a PCM cell in less time.

Likewise, in at least one embodiment, a current bias or voltage bias may be desirably applied in a manner so that for a PCM array, a temperature is reached to exceed any melt temperature for any cell of a PCM array. In this manner, variability in particular cells that may otherwise be a challenge to predict accurately may not be a significant factor affecting storage of memory states.

If operating in voltage mode, it may at times be a challenge to produce high current signal level values and also maintain reasonably well controlled voltage signal value levels. For example, in a situation in which different PCM cells, due at least in part to variability among cells of an array, may draw different amounts of current, circuit voltages may be disturbed in the form of supply noise, for example. However, in at least one embodiment, a desirable feature may include a cascode configuration employed for voltage mode operation of a controller. For example, referring to FIG. 3, gate 315 may be coupled in a manner to provide a cascode configuration for voltage mode operation of controller 210. Therefore, if multiple PCM cells of PCM array are being programmed, for example, with a cascode configuration, signal noise that may result from some PCM cells drawing excessive current may be electrically isolated from RAMP node. Therefore, a reduction of disturbance to programming other PCM cells may result.

Some portions of the preceding detailed description have been presented in terms of logic, algorithms or symbolic representations of operations on binary states stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated as electronic signals representing information. It has proven convenient at times, principally for reasons of common usage, to refer to such signals as bits, data, values, elements, symbols, characters, terms, numbers, numerals, information, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining," "establishing," "obtaining," "identifying," "selecting," "generating," or the like may refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device. In the context of this particular patent application, the term "specific device" may include a general purpose computer once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and storage of charge or a release of stored charge. Likewise, in other memory devices, a change of state may comprise a physical change or transformation in magnetic orientation or a physical change or transformation in molecular structure, such as from crystalline to amorphous or vice-versa. In still other memory devices, a change in physical state may involve quantum mechanical phenomena, such as, superposition, entanglement, or the like, which may involve quantum bits (qubits), for example. The foregoing is not intended to be an exhaustive list of all examples in which a change in state for a binary one to a binary zero or vice-versa in a memory device may comprise a transformation, such as a physical transformation. Rather, the foregoing are intended as illustrative examples.

A computer-readable (storage) medium typically may be non-transitory or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

The terms, "and," "or," and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

Methodologies described herein may be implemented by various approaches depending, at least in part, on applications according to particular features or examples. For example, such methodologies may be implemented in hardware, firmware, or combinations thereof, along with software. In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, electronic devices, other devices units designed to perform the functions described herein, or combinations thereof In the preceding detailed description, numerous specific details have been set forth to provide a thorough understanding of claimed subject matter. However, it will be understood by those skilled in the art that claimed subject matter may be practiced without these specific details. In other instances, methods or devices that would be known by one of ordinary skill have not been described in detail so as not to obscure claimed subject matter.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

What is claimed is:
1. A memory device, comprising:
   a controller to operate in a first mode and a second mode to program a memory cell, the controller comprising:
   a selector to select the first mode or the second mode as an operation mode of the controller, the selector oper- able to select the operation mode based at least in part on a previous operation of the controller;
a first ramp node to produce a first programming signal to program the memory cell to a set state in the first mode; and
a second ramp node to produce a second programming signal to program the memory cell to the set state in the second mode.

2. The memory device of claim 1, wherein the first mode comprises a voltage mode, wherein the first ramp node comprises a voltage ramp node, and wherein the first programming signal comprises a voltage programming signal.

3. The memory device of claim 1, wherein the second mode comprises a current mode, wherein the second ramp node comprises a current ramp node, and wherein the second programming signal comprises a current programming signal.

4. The memory device of claim 1, wherein the memory cell is programmable to a crystalline state or an amorphous state.

5. The memory device of claim 4, wherein the first ramp node is operable to produce the first programming signal to program the memory cell to the crystalline state or the amorphous state.

6. The memory device of claim 4, wherein the second ramp node is operable to produce the second programming signal to program the memory cell to the crystalline state or the amorphous state.

7. The memory device of claim 1, wherein the memory cell is programmable from a second state to the set state, wherein the set state comprises a first resistance state and the second state comprises a second resistance state different than the set state.

8. The memory device of claim 1, wherein the controller is configured to:
detect a signal value above a threshold; and
verify that the memory cell stores the set state in response to the detecting the signal value.

9. The memory device of claim 1, wherein the controller is configured to operate in a cascode configuration during the first mode.

10. The memory device of claim 1, wherein the controller is configured to:
detect a desired signal value above a threshold; and
cease the operation mode in response to detecting the desired signal value is produced.

11. The memory device of claim 1, wherein the selector comprises a plurality of transmission gates and at least one transmission gate of the plurality is configured to turn on to select the operation mode.

12. An apparatus comprising:
a memory device comprising a memory array;
a memory controller connected to the memory device, the memory controller configured to:
apply a first programming signal in a first operation mode to the memory array to program a set state;
determine whether the first programming signal programmed the memory array to the set state; and
apply a second programming signal in a second operation mode to the memory array to program the set state based at least in part on a determination whether the first programming signal programmed the memory array to the set state.

13. The apparatus of claim 12, wherein the memory controller is configured to:
determine a resistance level of the memory array; and
determine whether the first programming signal programmed the memory array to the set state based at least in part on the resistance level.

14. The memory device of claim 12, further comprising:
a plurality of gates to mirror the first programming signal or the second programming signal to provide a mirrored current programming signal, wherein the memory controller is configured to:
apply the mirrored current programming signal to a bitline of the memory array.

15. A system comprising:
a memory cell; and
a controller to operate in a first mode and a second mode to program the memory cell, the controller comprising:
a selector to select an operation of the controller in the first mode or the second mode;
a first ramp node to generate a first decreasing programming signal in the first mode; and
a second ramp node to generate a second decreasing programming signal in the second mode, wherein the controller is configured to change the operation from the first mode to the second mode to program the memory cell to a set state.

16. The system of claim 15, wherein the controller is configured to:
maintain the first decreasing programming signal at a first value or the second decreasing programming signal at a second value until the memory cell enters a melting phase.

17. The system of claim 15, wherein the first ramp node is configured to:
produce a substantially linearly decreasing first programming signal and the second ramp node is configured to produce a substantially linearly decreasing second programming signal.

18. The system of claim 15, further comprising:
a detector configured to detect that the second decreasing programming signal exceeds a signal value threshold, wherein the controller is operable to cease the second decreasing programming signal based at least in part on detection of the second decreasing programming signal exceeding the signal value threshold.

19. The system of claim 15, further comprising:
a detector to detect the first decreasing programming signal is lower than a signal value threshold.

20. The system of claim 15, wherein the memory cell comprises a layer of chalcogenide.

* * * * *